(12) United States Patent
Bailey, III

(10) Patent No.: US 7,282,909 B2
(45) Date of Patent: Oct. 16, 2007

(54) METHODS AND APPARATUS FOR DETERMINING THE THICKNESS OF A CONDUCTIVE LAYER ON A SUBSTRATE

(75) Inventor: Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 120 days.

(21) Appl. No.: 11/172,017

(22) Filed: Jun. 29, 2005

(65) Prior Publication Data

US 2007/0205765 A1    Sep. 6, 2007

(51) Int. Cl.
*G01B 7/06*  (2006.01)
*G01R 33/12*  (2006.01)

(52) U.S. Cl. ............ 324/230; 324/225; 324/202
(58) Field of Classification Search ............ 324/202, 324/225, 228–243
See application file for complete search history.

(56) References Cited

U.S. PATENT DOCUMENTS

| | | | | |
|---|---|---|---|---|
| 4,757,259 A | * | 7/1988 | Charpentier | 324/227 |
| 5,343,146 A | * | 8/1994 | Koch et al. | 324/230 |
| 5,541,510 A | * | 7/1996 | Danielson | 324/233 |
| 5,828,212 A | * | 10/1998 | Nix | 324/230 |
| 6,288,536 B1 | * | 9/2001 | Mandl et al. | 324/225 |
| 6,479,990 B2 | * | 11/2002 | Mednikov et al. | 324/225 |
| 6,724,187 B2 | * | 4/2004 | Nix | 324/230 |
| 6,741,076 B2 | * | 5/2004 | Le | 324/230 |
| 7,084,622 B2 | * | 8/2006 | Nix | 324/230 |
| 2004/0056654 A1 | * | 3/2004 | Goldfine et al. | 324/239 |
| 2004/0130322 A1 | * | 7/2004 | Crouzen | 324/229 |
| 2006/0056488 A1 | * | 3/2006 | Surname et al. | 374/184 |

OTHER PUBLICATIONS

International (PCT) Search Report mailed Mar. 7, 2007 re PCT/US06/23033.
Written Opinion mailed Mar. 7, 2007 re PCT/US06/23033.

\* cited by examiner

*Primary Examiner*—Jay M Patidar
(74) *Attorney, Agent, or Firm*—IP Strategy Group, P.C.

(57) ABSTRACT

A method of determining the thickness of a conductive film is disclosed. The method employs measured voltage and current responses that have been temperature-compensated to determine the thickness of the conductive film. The temperature compensation uses a temperature compensation factor obtained from a calibration substrate different from the target substrate on which the conductive film being measured is disposed. The calibration substrate has a conductive film formed of a conductive material that is substantially similar to the conductive material of the target substrate.

29 Claims, 7 Drawing Sheets

METHODS AND APPARATUS FOR DETERMINING THE THICKNESS OF A CONDUCTIVE LAYER ON A SUBSTRATE

BACKGROUND OF THE INVENTION

The present invention relates in general to substrate manufacturing technologies and in particular to methods and apparatus for optimizing an electrical response to a conductive layer on a substrate.

In the processing of a substrate, e.g., a semiconductor wafer, MEMS device, or a glass panel such as one used in flat panel display manufacturing, plasma is often employed. As part of the processing of a substrate (chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

Metals are particularly important materials in substrate manufacturing. For example, in a manufacturing method, known as dual damascene, dielectric layers are electrically connected by a conductive plug filling a via hole. Generally, an opening is formed in a dielectric layer, usually lined with a TaN or TiN barrier, and then subsequently filled with other conductive material (e.g., aluminum (Al), copper (Cu), tungsten (W), etc.) that allows electrical contact between two sets of conductive patterns. This establishes electrical contact between two active regions on the substrate, such as a source/drain region. Excess conductive material on the surface of the dielectric layer is typically removed by chemical mechanical polishing (CMP). A blanket layer of silicon nitride or silicon carbide may then be deposited to cap the copper.

Subsequently, in order to insure that the process is within acceptable parameters, it is often important to determine the electrical film/layer properties (e.g., thickness, sheet resistance, etc.) of a conductive layer at a particular point on the substrate. One method of measurement is the use of eddy current sensors. Generally, eddy currents are currents that are induced in a conductive media by an alternating magnetic field.

In general, if a first alternating current is applied to a wire wrapped in a generally solenoidal shape (e.g., the wire in an eddy current sensor), a first alternating electromagnetic field forms in and around the solenoid extending beyond the ends of the solenoid a distance on the order of the diameter of the solenoid. If this first field is brought into proximity with a second conductor (e.g., a conductive layer on the substrate) a second alternating electrical current will also flow in the second conductor, causing a second field that interacts with (e.g., adds vectorally to) the first field and results in a perturbation to the field around the probe. These perturbations in the probe's initial field may cause detectable changes in the probe's electrical characteristics including the probe's impedance and frequency response. Using an impedance-voltage converter, the impedance change can be converted into a voltage change for further signal processing and analysis.

Many techniques are available for producing a signal from these detected differences in eddy current probe characteristics. For example, in a first technique, the width of the frequency dependent power absorption of the probe/eddy current sensor system (sensor system) can be reported. Likewise, in a second technique, the change in the magnitudes of the real and/or imaginary parts of the probe impedance can be reported between the probe and the second conductor. These measurements are generally made using passive or active circuitry to produce a range of voltages that can be bounded by the signal with no second conductor present and the signal with a second conductor causing maximal change in the signal. The exact shape, thickness and conductivity of the second conductor that causes the maximal change in the probe signal generally depends on the probe geometry, excitation frequency and the method adopted for measurement, but generally it is a thick (on the order of many times the diameter of the probe) conductive film (layer) placed as near to the probe as possible.

Depending on the application, conductive or magnetic elements can also be incorporated into the design of the probe in order to modify the spatial extent and magnitude of the probe field and hence the spatial and electrical sensitivity to the second conductive layer. For optimum performance, the sensor system should maximize sensor system sensitivity to the desired electrical property of the conductive film (e.g., thickness, sheet resistance, etc.) while minimizing the sensor system's sensitivity to all other effects and variables.

Generally, the electrical response of sensor to the magnetic field (eddy current perturbations), and hence its accuracy, is affected by the proximity (substrate proximity response) of the sensor to the substrate. That is, as the exciting probe field is of limited spatial extent and its, magnitude decreases as the position increases from the probe, the overall eddy current perturbations caused by a second conductor being measured also decrease as the second conductor is moved further from the probe. Thus, an eddy current sensor may be sensitive to both proximity and electrical film properties. In general, it is difficult to isolate the portion of the electrical response caused by the set of electrical film properties (electrical film property response) from the portion of the electrical response caused by proximity (substrate proximity response), which may subsequently introduce an error in the reported value.

In addition, the set of electrical film properties for a particular substrate may itself be variable. For example, the electrical response of sensor may be affected by the resistivity of the conductive film. That is, eddy current signal variation is primarily proportional to the inverse of film resistivity. Electrical resistivity (also known as specific electrical resistance) generally indicates how strongly a material opposes the flow of electric current. A low resistivity generally indicates a material that readily allows the movement of electrons. However, resistivity is also generally dependent on temperature.

Referring now to FIG. 1, a simplified diagram of an eddy current sensor is shown. Generally, changes in the sensor's coil impedance 102 are caused by varying the distance 104 between the sensor (coil) and substrate 106. Since the electrical parameters of target material resistivity and permeability may determine the magnitude of the measured sensor perturbation, the sensor system is generally calibrated for the target material.

One solution to improve the response of a given sensor may be to average out the proximity errors of multiple sensors, each concurrently trying to measure the same point on the substrate from the same proximity (e.g., concurrent multiple sensors). For example, two sensors, each with a known and fixed proximity to each other, may be positioned at a fixed proximity to a conductive layer positioned between them. In a common implementation, one sensor is positioned above the substrate and the other sensor is positioned below the substrate. If each sensor has a substantially identical sensitivity to proximity, the electrical response on any one sensor may be substantially equal but opposite to the electrical response on the other sensor. Subsequently, averaging together a signal from each sensor may result in a combined signal that is much less sensitive to the position (proximity) of the conductive layer to either one of the two sensors, and which subsequently may be used to better report the desired electrical property of the conductive film (e.g., more independent of proximity).

By periodically calibrating the sensor system (sensors, substrate geometry and substrate handling, stage movements, etc.) prior to making measurements, the proximity error in theory may be cancelled out by averaging a pair of measurements taken when the substrate is placed in the known position between the sensors. In practice, however, it is often very difficult to repeatably and precisely position the eddy current sensors with respect to the measured conductive layer.

For example, the equipment used to position a substrate between sensors may have a tolerance range that is too broad, so that the perturbations of the sensors due to changes in the substrate film thickness are substantially similar when compared to the sensor perturbations measured due the differing proximities at different measurement placements or times. Likewise, a mechanism used to move the substrate with respect to the sensors (i.e., turntable, etc.) may induce vibrations in the substrate or changes in the substrate proximity with amplitudes that cause perturbations in probe signals that exceed the measured differences in film thickness or introduce uncertainty in the reported film thickness in excess of the desired precision for the sensor system. Subsequently, even relatively small proximity variations may introduce substantial errors in the measurements, presenting a problem for high precision measurements, such as substrate manufacturing.

In addition, even if the proximity error for concurrent multiple sensors could be substantially minimized, it may still be desirable to make the measurements at different points in time (e.g., sequential measurement). For example, since sensors are often located on a sensor swing arm, it may be inconvenient to align both sensors when moving the sensor swing arm across the surface of the substrate. That is, two sensors may be placed on the sensor swing arm such that they form a line parallel to a vector that is tangent to the rotation of the substrate on a turntable. As the sensor arm swings across the rotating substrate, the angle between the sensor line and the tangent vector may increase to the point at which both sensors cannot be positioned over the same point on the substrate at the same time. Additionally, the sensor swing arm construction itself may prevent locating the sensors on top of each other, or interference from one sensor (e.g., cross talk) may prevent the simultaneous use of both sensors.

Referring now to FIG. 2, a simplified diagram of a substrate in a mechanism to rotate it with a sensor arm is shown. In this example, substrate 202 rotates in direction 208, as sensor swing arm 204 moves sensors 206 across the surface of substrate 202.

In view of the foregoing, there are desired methods and apparatus for optimizing an electrical response to a conductive layer on a substrate.

SUMMARY OF THE INVENTION

The invention relates, in one embodiment, to a method of determining a first thickness of a first conductive film formed of a first conductive material on a target substrate. The method includes positioning a first eddy current sensor near a set of positions on the target substrate. The method also includes measuring, using the first eddy current sensor, a first set of electrical responses that includes at least one of a first voltage measurement and a first current measurement. The method further includes correcting the set of first electrical responses using a temperature-dependent compensation factor, thereby obtaining a corrected first set of electrical responses, the temperature-dependent compensation factor being obtained from a calibration substrate different from the target substrate, the calibration substrate having a second conductive film formed of a second conductive material that is substantially similar to the first conductive material of the target substrate; and determining the first thickness using the corrected first set of electrical responses.

The invention relates, in another embodiment, to an arrangement for determining a first thickness of a first conductive film formed of a first conductive material on a target substrate. The arrangement includes means for measuring, using a first eddy current sensor positioned near the target substrate, a first set of electrical responses that includes at least one of a first voltage measurement and a first current measurement. The arrangement also includes means for correcting the set of first electrical responses using a temperature-dependent compensation factor, thereby obtained a corrected first set of electrical responses; and means for determining the first thickness using the corrected first set of electrical responses.

The invention relates, in another embodiment, to a method of determining a first thickness of a first conductive film formed of a first conductive material on a target substrate. The method includes positioning a first eddy current sensor near the target substrate. The method also includes measuring, using the first eddy current sensor, a first set of electrical responses that includes at least one of a first voltage measurement and a first current measurement. The method further includes correcting the set of first electrical responses using a temperature-dependent compensation factor that is determined based on a target substrate temperature at which the first set of electrical responses are obtained, the correcting resulting in a corrected first set of electrical responses; and determining the first thickness using the corrected first set of electrical responses.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

Figure 6:
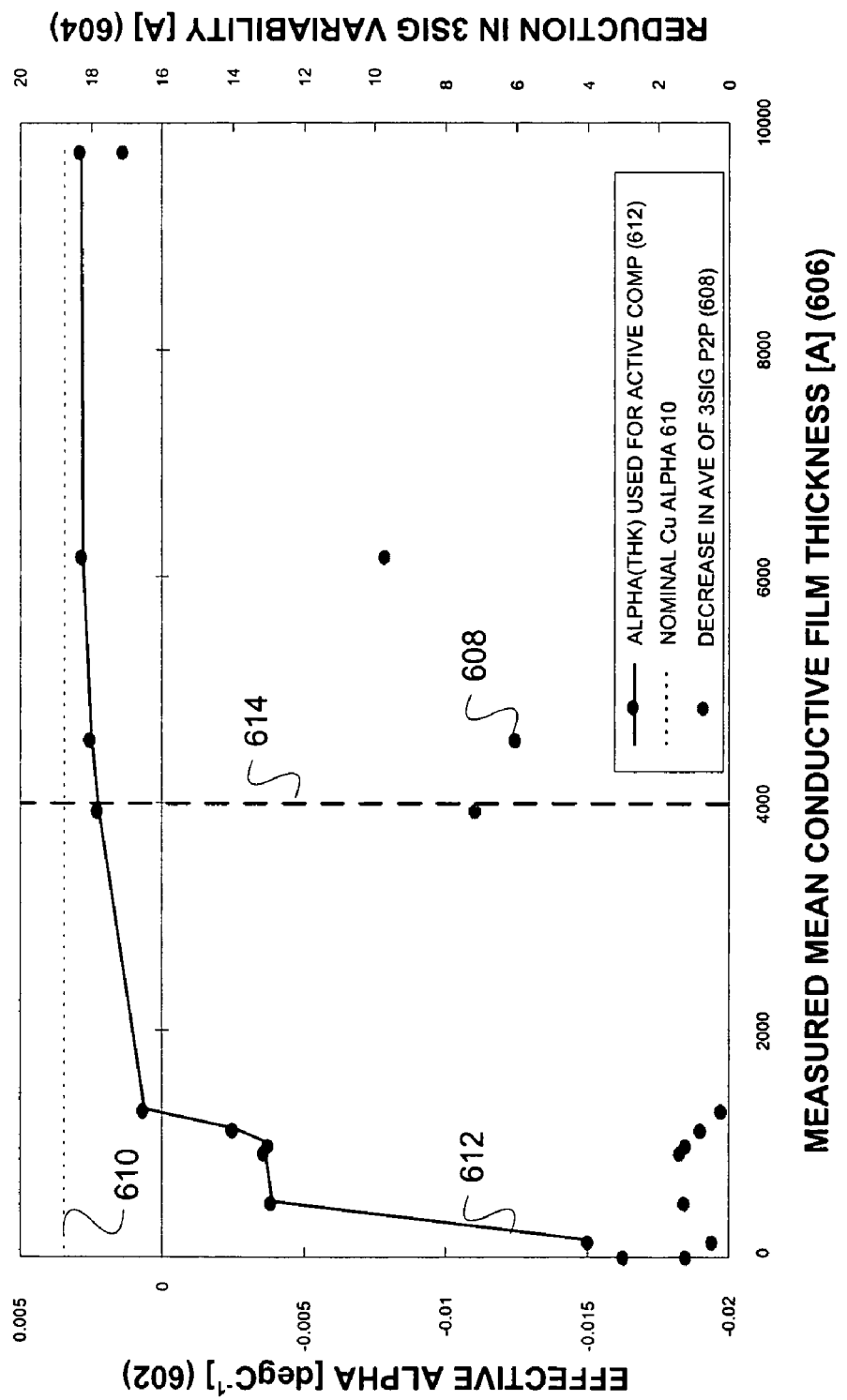
Figure 7:
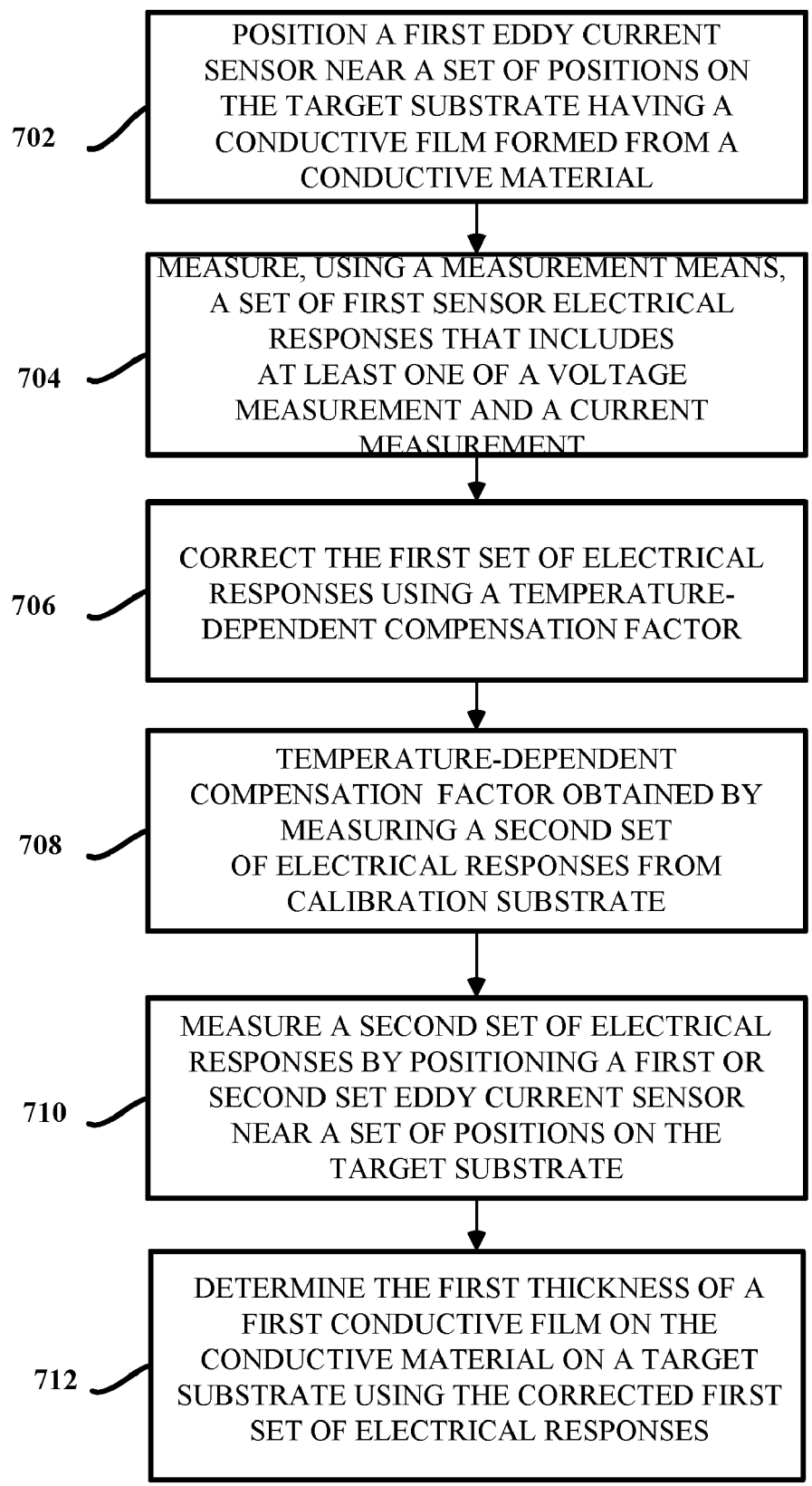

C. and about 23° C. across 90 minutes, according to an embodiment of the invention;

FIG. 6 illustrates a simplified diagram comparing temperature coefficient α to mean thickness for a conductive film substantially comprising Cu, according to one embodiment of the invention; and, FIG. 7 illustrates a simplified diagram of a method for determining a thickness of a conductive film formed of a conductive material on a target substrate, according to one embodiment of the invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that variations in substrate electrical film properties may be compensated for, in order to optimize sensor electrical response. In an embodiment, a sensor electrical response of a reference substrate sample at a known temperature may be used to correct the sensor electrical response of a target substrate at an unknown temperature. In an embodiment, the conductive layer material of the reference substrate is substantially similar to the conductive layer material of the target substrate.

In an embodiment, the reference substrate and the target substrate are measured using substantially similar measurement protocols. For example, both the reference substrate and the target substrate may be measured using the same eddy current measurement technique, at about the same proximity, and at about the same measurement sites (geometry), etc., such that the major variable between the reference substrate and the target substrate is temperature. In an embodiment, if the substrate has two conductive films with differing resistivity temperature coefficients, a set of measurements may be taken at different temperatures in order to derive a substantially temperature independent value of a desired film thickness.

Various embodiments are described hereinbelow, including methods and techniques. It should be kept in mind that the invention may also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general purpose computer and/or a dedicated computing device when appropriately programmed and may include a combination of a computer/computing device and dedicated/programmable circuits adapted for the various tasks pertaining to embodiments of the invention. Examples of such apparatus may include appropriate dedicated and/or programmable circuitry in one or more integrated circuits configured to carry out the computer-implemented techniques disclosed herein. In addition, and in general, for any calculation using a computer, operands in memory or computer registers are required.

As previously stated, the electrical response of sensor to the magnetic field (eddy current perturbations), and hence its accuracy, is affected by the proximity (substrate proximity response) of the sensor to the substrate. That is, as the exciting probe field is of limited spatial extent and its magnitude decreases as the position increases from the probe, the overall eddy current perturbations caused by a second conductor being measured also decrease as the second conductor is moved further from the probe. Thus, an eddy current sensor may be sensitive to both proximity and electrical film properties. In general, it is difficult to isolate the portion of the electrical response caused by the set of electrical film properties (electrical film property response) from the portion of the electrical response caused by proximity (substrate proximity response), which may subsequently introduce an error in the reported value.

In addition, the set of electrical film properties for a particular substrate may itself be variable. For example, the electrical response of sensor may be affected by the resistivity of the conductive film. That is, eddy current signal variation is primarily proportional to the inverse of film resistivity. Electrical resistivity (also known as specific electrical resistance) generally indicates how strongly a material opposes the flow of electric current. A low resistivity generally indicates a material that readily allows the movement of electrons. However, resistivity is also generally dependent on temperature.

In general, each sensor response, R, can be modeled as a function of several key variables $$R(-)=R(d,p,S,\rho(T)) \qquad \text{[EQUATION 1]}$$

where d is film thickness to be measured, p is proximity and S is generally the sensor serial number which is a short hand notation denoting the functional dependence of the response on all the information about the conversion of the detected perturbation of the particular eddy current probe's field by the measured film into a convenient measurement unit, and ρ(T) is the temperature dependent resistivity. In an embodiment, the convenient measurement unit is volts (V). Assuming that all sensors have the same sensor serial number, EQUATION 1 may be further simplified to:

$$R(-)=R(d,p,\rho(T)) \qquad \text{[EQUATION 2]}$$

Therefore, the thickness d of a conductive film on the substrate may be modeled as:

$$d=f(R(d,p,\rho(T))) \qquad \text{[EQUATION 3]}$$

Electrical resistivity (also known as specific electrical resistance) is generally indicates how strongly a material opposes the flow of electric current. A low resistivity generally indicates a material that readily allows the movement of electrons. The SI unit for electrical resistivity is the ohm meter. The electrical resistivity of a material is usually given by $$\rho = \frac{RA}{l} \qquad \text{[EQUATION 4]}$$

where ρ is the electrical resistivity (measured in ohm meters), R is the resistance of a uniform specimen of the material (measured in ohms), l is the length of the specimen (measured in meters), and A is the cross-sectional area of the specimen (measured in square meters).

Electrical resistivity can also be defined as:

$$\rho = \frac{E}{J} \quad \text{[EQUATION 5]}$$

where E is the magnitude of the electric field (measured in volts per meter) and J is the magnitude of the current density (measured in amperes per square meter).

Figure 1:
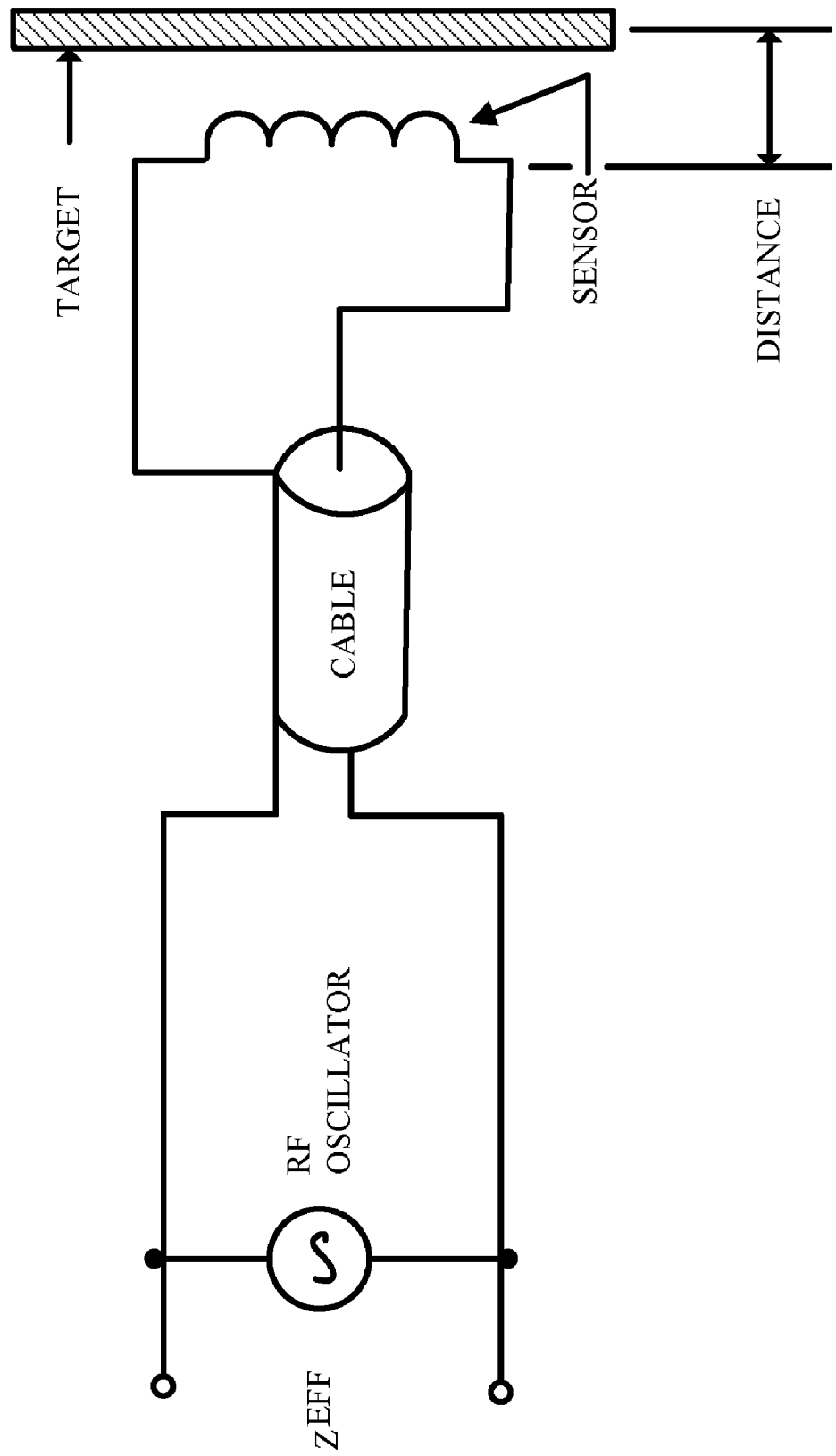
FIG. 1 illustrates a simplified diagram of an eddy current sensor.
Figure 2:
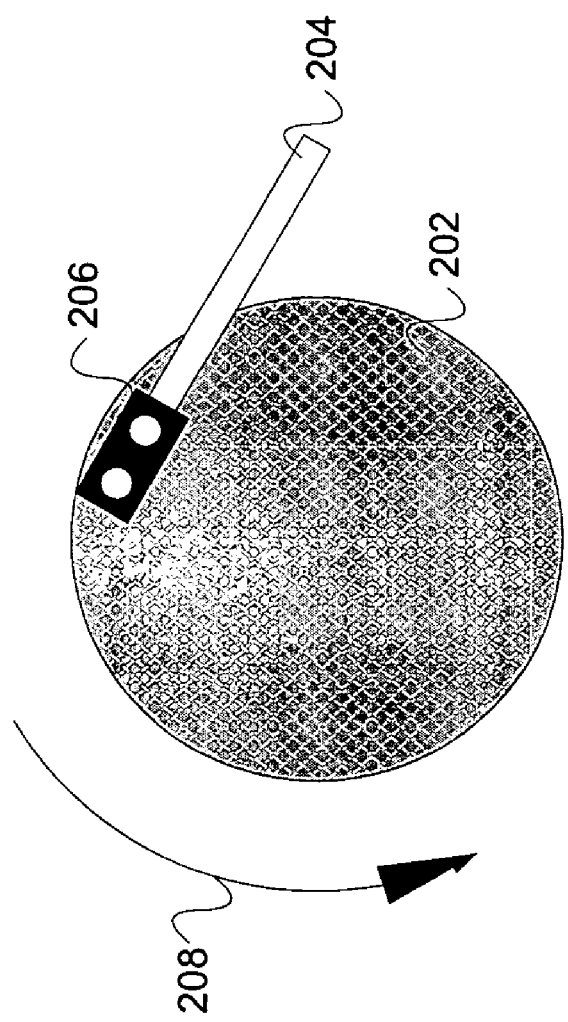
FIG. 2 illustrates a simplified diagram of a substrate on a turntable with a sensor arm.
Figure 3:
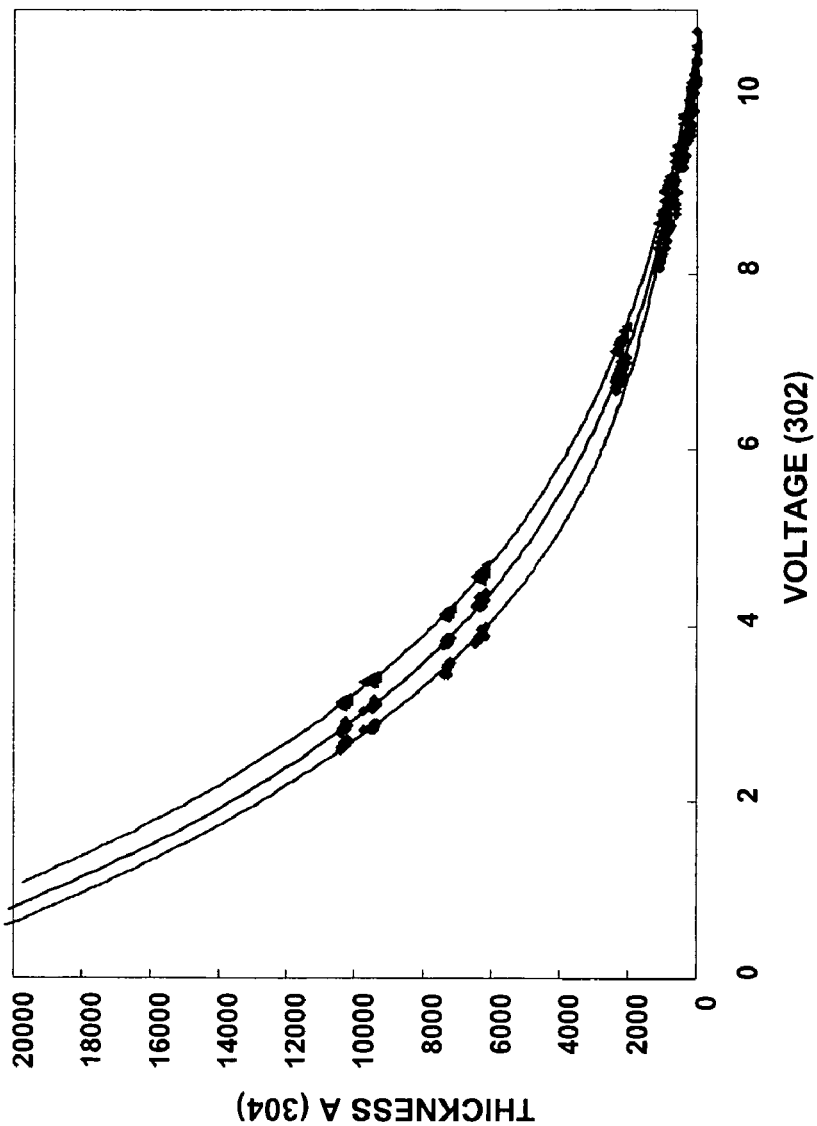
FIG. 3 illustrates a set of three calibration curves for determining the thickness of a conductive layer on a substrate, according to one embodiment of the invention.

Referring now to FIG. 3, a set of three calibration curves at a particular substrate temperature (calibration temperature) for determining the thickness of a conductive layer (i.e., Cu, etc.) on a substrate is shown, according to one embodiment of the invention. The vertical axis shows thickness 304 measured in Angstroms (Å), while the horizontal axis shows the voltage response (V) 302 as measured by the eddy current sensor. In this example, a higher response voltage correlates to a smaller thickness. Calibration curves may also be created for the same purpose with the response voltage decreasing, e.g., by offsetting each probe response voltage by its maximum voltage obtained in the system with no film to be measured.

In a simplified example, at a particular substrate temperature, the reported eddy current response V (voltage), with reasonable proximity correction properties, may be modeled as:

$$2V = R_I(d,p_I) + R_{II}(d,p_{II}) \approx R_I(d,p_I) + \in_p \cdot dR_I/dp + R_{II}(d,p_{II}) - \in_p \cdot dR_{II}/dp \quad \text{[EQUATION 6]}$$

where if $\in_p$ is the proximity variation from $p_I$ at the actual time of the measurement for sensor I, then, inferring from the fixed geometry between sensor I and sensor II, $-\in_p$ is the proximity variation from $p_{II}$ at the actual time of the measurement for sensor II if and only if the measurement from sensor II is made simultaneously. For purposes of this example, the sensor serial number S is assumed to be the same for all sensors, only d and p will be considered for purposes of the calculations. In addition, although the responses are shown in voltage, other electrical characteristics such as current may be used as well.

Both sensors are assumed have a substantially identical response at their nominal proximity $R(d,p_I)=R(d,p_{II})$ to film thickness. In practice, this can be reasonably done mechanically as mentioned below or with sensor dependent correlation functions. In addition, the response sensitivity for both sensors to proximity variation (e.g., proximity electrical response) is also assumed to be the same in magnitude. Subsequently, $dR_I/dp$ evaluated at $p_I$ equals $dR_{II}/dp$ evaluated at $p_{II}$ and the proximity dependent terms in EQUATION 6 cancel out and provide a proximity independent measurement which can be correlated with the film thickness.

In an embodiment, this may be accomplished by using a set of paired sensors of substantially the same type (hence about same performance) and loading the substrate halfway between them. Subsequently, the film may have the same nominal proximity to both sensors. Therefore, canceling out terms, the simplified reported measurement can be shown to be:

$$2V = 2R(d) + 0 \quad \text{[EQUATION 7]}$$

which may be independent of small proximity variations. In a simplified example, for a single sensor, if $R_I(d,p_I)=R_{II}(d,p_{II})=1.5V$, and if $dR_I/dp=2V/mm$, $\in_p=0.1$ mm, then:

$$2V = R_I(d,p_I) + \in_p \cdot dR_I/dp + R_{II}(d,p_{II}) - \in_p \cdot dR_{II}/dp = 1.5V + 2V/nm*0.1 \text{ mm} + 1.5V - 2V/nm*0.1 \text{ mm} = 3V \quad \text{[EQUATION 8]}$$

Thus in an ideal simultaneous measurement situation this method yields about 0% in proximity error or typically about $3\sigma<0.03V$. It should be clear that these analyses may be carried out with appropriate changes in weighting proportion between the two sensors in the sum in order to ensure cancellation of the relevant proximity terms or to include more than two sensors, but the fundamental properties described remain.

However, it may not be practical to measure the substrate at the calibration temperature. For example, a substrate process may require that the substrate be heated to a temperature substantially above the calibration temperature. Subsequently waiting for the substrate to cool down, just to take a set of measurements, may result in substantially decreased production throughput. However, temperature may affect the underlying resistivity of a conductive film, and hence affects the measured eddy current response.

Figure 4:
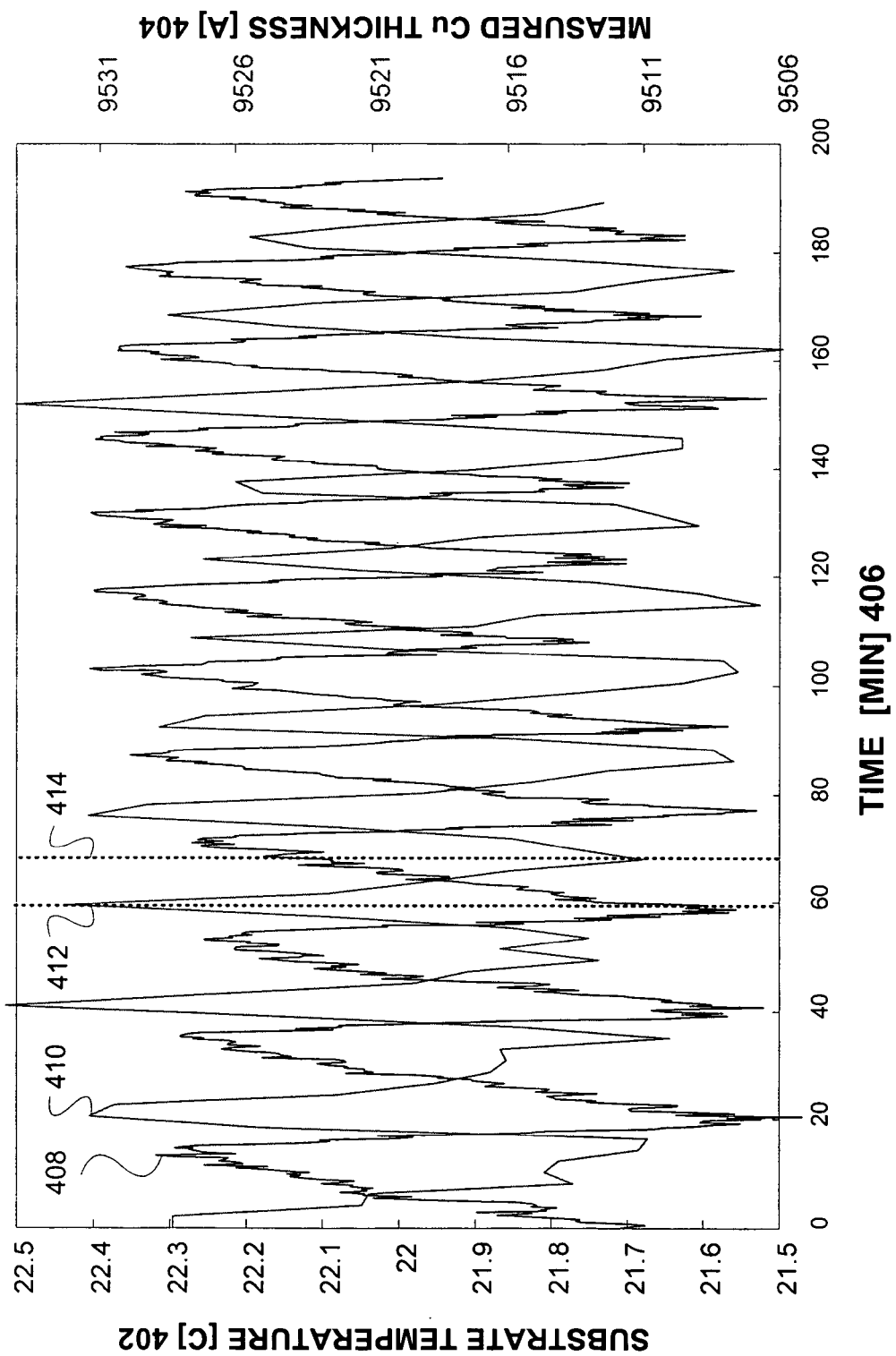
FIG. 4 illustrates a simplified diagram of a substrate with a conductive film comprising Cu, cycled between about 21° C. and about 23° C. across 90 minutes, according to an embodiment of the invention.

Referring now to FIG. 4, a simplified diagram of a substrate with a conductive film comprising Cu, cycled between about 21° C. and about 23° C. across 200 minutes, according to an embodiment of the invention. The horizontal axis 406 represents time in minutes, the left-hand vertical axis 402 represents substrate temperature in degrees (° C.), while right-hand vertical axis 404 represents conductive film thickness in angstroms (Å) reported by the eddy current system. Plot 408 represents change in substrate and film temperature over about the 200 minute interval, while plot 410 shows the corresponding change in the reported conductive film thickness measured by the eddy current system. In this example, Cu has a temperature coefficient ($\alpha$) of 0.0035/deg C. As substrate temperature 408 moves in one direction, increasing or decreasing, the corresponding conductive film thickness (as measured by eddy current response) moves in the opposite direction. For example, at about 60 minutes (412), the substrate temperature is about 21.58° C., while the corresponding conductive film thickness is about 9536 Å. However, at about 68 minutes, the substrate temperature is about 22.10° C., while the corresponding conductive film thickness is about 21.68 Å.

Figure 5:
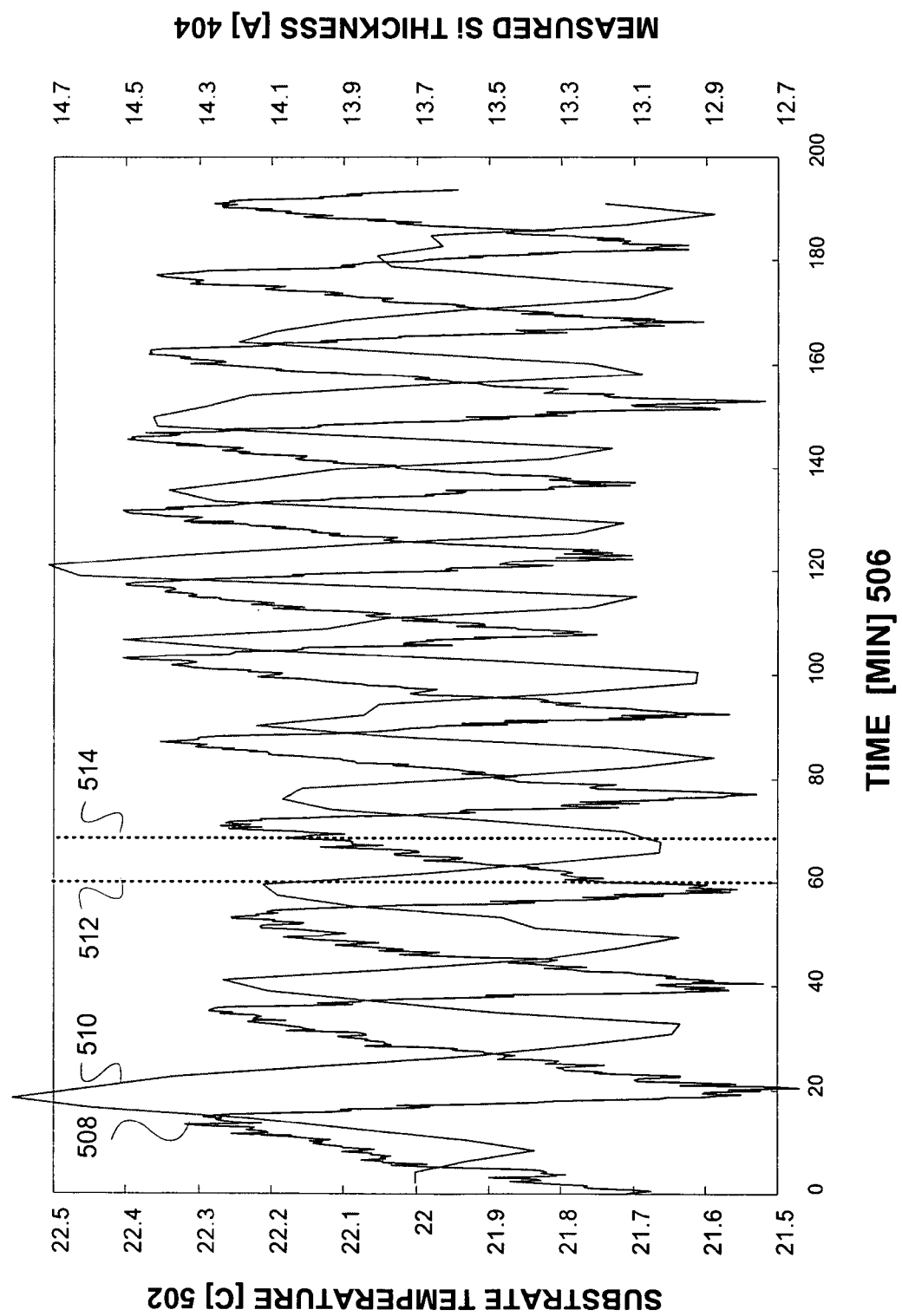
FIG. 5 illustrates a simplified diagram of a substrate with a conductive film comprising Si, cycled between about 21°

Referring now to FIG. 5, a simplified diagram of a substrate with a conductive film comprising Si, cycled between about 21° C. and about 23° C. across 200 minutes, according to an embodiment of the invention. The horizontal axis 506 represents time in minutes, the left-hand vertical axis 502 represents substrate temperature in degrees (° C.), while right-hand vertical axis 504 represents conductive film thickness in angstroms (Å). Plot 508 represents change in substrate temperature over about the 200 minute interval, while plot 510 shows the corresponding change in measured conductive film thickness. In this example, Si has a temperature coefficient ($\alpha$) of $-0.011/\text{deg C}$. As substrate temperature 508 moves in one direction, increasing or decreasing, the corresponding conductive film thickness (as measured by eddy current response) moves in the opposite direction. For example, at about 60 minutes (512), the substrate temperature is about 21.63° C., while the corresponding conductive film thickness is about 14.15 Å. However, at about 68 minutes, the substrate temperature is about 22.12° C., while the corresponding conductive film thickness is about 13.1 Å.

Subsequently, if the change in resistivity is proportional to a corresponding change in temperature for a given material as some given temperature range, then a change in the resistivity of a conductive layer on a substrate due to a change temperature in that temperature range may be modeled as:

$$\rho(T_c+\tau) = \rho(T_c)(1+\alpha(\tau-T_c)) \quad \text{[EQUATION 9]}$$

where $\rho(T_c)$ is the resistivity in ohm meters of the conductive film at the calibration temperature (calibration resistivity), $\tau$ is the temperature deviation of the target substrate from the calibration temperature, and $\alpha$ is the temperature coefficient for the conductive film in deg C.$^{-1}$. Typical values of $\alpha$ are: for Cu about +0.0039 to about 0.0068 deg. C$^{-1}$, for Si about −0.07 to about −0.01 deg. C$^{-1}$, and can be looked up or measured as described below for most materials of interest Subsequently, for relatively small changes in temperature, the resulting change in the measured conductive film thickness may be substantially directly proportional to the measured resistivity $\rho(T_m)$, and substantially inversely proportional to the calibration resistivity $\rho(T_c)$. Thus, EQUATION 3 may be further simplified as:

$$D_M = \frac{\rho(T_c)}{\rho(T_m)} f(R(d_n, p, \rho(T_c))) \quad \text{[EQUATION 10]}$$

where, $d_m$ is the conductive film thickness derived from the eddy current response measurement, $d_a$ is the actual conductive film thickness, $T_c$ is the calibration temperature, $T_m$ is the substrate temperature of the measured eddy current response of interest (measurement temperature), $f(R(d_a, p, \rho(T_c)))$ is the conductive film thickness at the calibration temperature $T_c$, p is the sensor proximity to the conductive film, $\rho(T_c)$ is resistivity of the conductive film at the calibration temperature $T_c$ (calibration resistivity), $\rho(T_m)$ is resistivity of the conductive film at the measurement temperature $T_m$ (measured resistivity).

Substituting EQUATION 9 into EQUATION 10:

$$d_m = \frac{f(R(d_a, p, \rho(T_c)))}{(1+\alpha(\tau-T_c))} = \frac{f(R_c)}{(1+\alpha\Delta T)} \quad \text{[EQUATION 11]}$$

where, $f(R(d, p, \rho(T_c)))$ or $f(R_c)$ is the thickness of the conductive film on the substrate at the calibration temperature, $\tau-T_c$ or $\Delta T$ is the difference in temperature between the calibration temperature and the temperature at which the eddy current was measured, and $\alpha$ is the temperature coefficient for the conductive film in deg. C.$^{-1}$. For a small $(\alpha\Delta T)^2$ product (e.g., ≈0.0), EQUATION 11 can be further simplified to:

$$d = \frac{f(R_c)}{(1+\alpha\Delta T)} \frac{(1+\alpha\Delta T)}{(1+\alpha\Delta T)} = \quad \text{[EQUATION 12]}$$

$$\frac{f(R_c) - f(R_c)\alpha\Delta T}{1-(\alpha\Delta T)^2} \approx f(R_c) - f(R_c)\alpha\Delta T$$

Subsequently, small eddy current perturbations caused by temperature may be detected. For example, for a conductive film comprised of Cu, a perturbation of about 0.4% of the total may be measured. In addition, this perturbation may be measured independently of sensor proximity p. For example, proximity variations may be cancelled out by techniques, such as using a set of paired sensors of substantially the same type and loading the substrate halfway between them, as previously described.

In an embodiment, an electrical response of a reference substrate at a known temperature may be used to correct the electrical response of a target substrate at an unknown temperature. That is, for a reference substrate and a target substrate at a substantially similar but unknown temperature, but which have substantially the same resistivity response to a temperature change, and a set of set of calibration curves for the reference substrate at a known temperature, the resistivity correction $\rho(T_c)/\rho(T_m)$ for the target substrate may be determined by combining EQUATION 3 and EQUATION 10 as follows:

$$d_{c-ref} = f(R(d_a, p, \rho(T_c))) \quad \text{[EQUATION 13]}$$

$$d_{m-ref} = f(R(d, p, \rho(T_m))) = \frac{\rho(T_c)}{\rho(T_m)} d_{c-ref} \quad \text{[EQUATION 14]}$$

where, $d_{c-ref}$ is the measured conductive film thickness on the reference substrate at the calibration temperature, which is generally equal to the actual conductive film thickness $d_a$, and $d_{m-ref}$ is the measured conductive film thickness on the reference substrate at the measurement temperature, $\rho(T_c)$ is the resistivity of the reference substrate at the calibration temperature $T_c$, and $\rho(T_m)$ is the resistivity of the reference substrate at a measured temperature $T_m$, which is also substantially similar to the resistivity of the target substrate at the same temperature.

Assuming a reference substrate is configured to have a substantially similar eddy current response as a target substrate, then a change in the reference conductive film thickness between a calibration and measurement temperature (auto compensation factor) may be used to correct the eddy current response of the target substrate. Thus, EQUATION 14 may be rewritten as:

$$d_{m-tar} = \eta \frac{\rho(T_c)}{\rho(T_m)} f(R(d, p)) \quad \text{[EQUATION 15]}$$

where, $\eta$ is an auto compensation factor $d_{c-ref}/d_{m-ref}$, $d_{c-ref}$ is the measured conductive film thickness on the reference substrate at the calibration temperature, $d_{m-ref}$ is the measured conductive film thickness on the reference substrate at the measurement temperature, $\rho(T_c)$ is the resistivity of the reference substrate at the calibration temperature $T_c$, and $\rho(T_m)$ is the resistivity of the reference substrate at a measured temperature $T_m$, and, since we've explicitly modeled the resistivity dependence as shown in EQUATION 10, $f(R(d,p))$ is a function of conductive film thickness that is independent of temperature. Substituting for $\eta$:

$$d_{m-tar} = \frac{d_{c-ref}}{d_{m-ref}} \frac{\rho(T_c)}{\rho(T_m)} f(R(d, p)) \quad \text{[EQUATION 16]}$$

Substituting EQUATION 14 into EQUATION 16:

$$d = \frac{d_{c-ref}}{\left(\frac{\rho(T_c)d_{c-ref}}{\rho(T_m)}\right)} \frac{\rho(T_c)}{\rho(T_m)} f(R(d, p)) = f(R(d, p)) \quad \text{[EQUATION 17]}$$

In an embodiment, $d_{m-ref}$ of the reference substrate may be measured by an eddy current sensor prior to measuring $d_{m-tar}$ of the target substrate. In an embodiment, $d_{m-ref}$ of the reference substrate may be measured by an eddy current sensor after measuring $d_{m-tar}$ of the target substrate or the average of the before and after $d_{m-ref}$ measurements may be used to minimize errors due to temperature drifts during measurement of multiple target sites on the substrate. As previously stated, and in general, measured conductive film thickness is related to conductive film temperature. Hence, in environments where the temperature may be changing, a good approximation of the reference substrate conductive film thickness $d_{m-ref}$, at least for purposes of calculation, may be derived by averaging a $d_{m-ref}$ taken before the measurement of $d_{m-tar}$, to a $d_{m-ref}$ taken after. In an embodiment, the reference substrate is a small landing pad of known Cu conductive film thickness that is positioned relative to one or more positions near a given point on the substrate to be measured.

In an embodiment, the thickness of a target conductive film on a substrate with a plurality of conductive films may be may be determined. In general, a measured eddy current response on a substrate includes the aggregate responses of all conductive films on that substrate. However, for a set of conductive films, each with a different resistivity ρ with respect to temperature, a particular conductive film eddy current response may be isolated by measuring the aggregate eddy current response at n different temperatures, where n is the number of conductive films on the substrate. In practice the behavior of the film stack to small changes in ΔT can be described by an effective temperature coefficient $\alpha_{eff}$. The same auto compensation factor approach may then be used since it does not depend on the knowledge of the numerical value of the temperature coefficient, but only that the reference sample behave like the target wafer.

Referring now to FIG. 6, a simplified diagram comparing temperature coefficient α to mean thickness for a conductive film substantially comprising Cu, according to one embodiment of the invention. The horizontal axis 606 shows the measured mean conductive film thickness in Angstroms (Å). Left vertical axis 602 shows effective temperature coefficient (α) of the substrate with film stack. The horizontal line 610 shows the nominal value of the temperature coefficient 0.0035/deg C. for Cu. The curve 612 shows the variation in effective alpha for the substrate with film stack. Right vertical axis 604 shows reduction in 3σ variability in Angstroms (Å) observed by implementation of the invention. That is, the improvement in eddy current reported thickness repeatability caused by correction of 2-3° C. variation in room temperature. This improvement is shown as point plots 608.

In general, above a certain threshold, as the eddy current response due to that target film increases (e.g. a thicker conductive film), the effective temperature coefficient (α) of a conductive film, shown by 612, approaches the nominal temperature coefficient (α) for that conductive film, shown by 610. Hence, only a relatively small number of reference samples may be required to calibrate the eddy current response to a measured conductive film thickness. The actual number of reference samples will generally depend on the precision of the temperature compensation desired, as well as the thickness range of the target conductive film. For example, the temperature compensation for copper films less than ~4000 Å, at 614, may be quite small and could be ignored, while for copper films greater than ~4000 Å significant improvement could be obtained with a single reference sample with copper thickness in the range of 10,000 Å. The selection of the appropriate correction coefficient within the small number of reference samples may be based on the estimate of the target film thickness from the uncorrected first measurements of the target film.

As was previously mentioned, in general, a measured eddy current response on a substrate includes the aggregate responses of all conductive films on that substrate. However, for a set of conductive films, each with a different resistivity ρ with respect to temperature, a particular conductive film eddy current response may be isolated by measuring the aggregate eddy current response at n different temperatures, where n is the number of conductive films on the substrate. If the conductive films have different temperature coefficients, this knowledge may be used to differentiate the portion of the eddy current measurement caused by different films. For example, a substrate with two conductive films (i.e., Cu, Si, etc.) may be measured at two different temperatures, in order to substantially isolate and thus determine the eddy current response attributed to one of the conductive films.

At any given temperature T, a substrate with two conductive films may be modeled as:

$$V = R(d_{A-cF1}, P, \rho_{CF1}(T_m)) + \beta R(d_{A-CF2}, P, \rho_{CF2}(T_m)) \quad \text{[EQUATION 18]}$$

where $d_{A-CF1}$ is the actual thickness of a first conductive film on the reference substrate, $d_{A-CF2}$ is the actual thickness of a second conductive film on the reference substrate, p is the sensor proximity to the conductive film, $\rho_{CF1}$ (T) is resistivity of the first conductive film at a temperature T, $\rho_{CF2}$ (T) is resistivity of the second conductive film at the temperature T, β is a conductive film thickness dependent ratio (e.g., to account for conductive film 3-d effects such as very thick copper dominating the temperature behavior on Si substrates as shown in the previous figure), and V is eddy current response in volts.

Substituting, EQUATION 14 into EQUATION 18, $$V = \frac{\rho_{CF1}(T_c)}{\rho_{CF1}(T_m)} R_{c-CF1} + \frac{\rho_{CF2}(T_c)}{\rho_{CF2}(T_m)} \beta R_{c-CF2} \quad \text{[EQUATION 19]}$$

where $T_m$ is the temperature at which the eddy current response is measured, $T_c$ is the calibration temperature, $\rho_{CF1}$ ( ) is resistivity of the first conductive film, $\rho_{CF2}$ ( ) is resistivity of the second conductive film, $R_{c-CF1}$ is the eddy current response of the first conductive film at the calibration temperature, $R_{c-CF2}$ is the eddy current response of the second conductive film at the calibration temperature, β is a conductive film thickness dependent ratio, and V is eddy current response in volts. Thus, for a substrate with two conductive films at a given temperature, there are generally two unknowns, $R_{c-CF1}$ and $\beta R_{c-CF2}$.

However, if the aggregate eddy current response of a substrate with two conductive films is generally measured at least at two different temperatures, the eddy current response of an individual conductive film may be determined. For example, EQUATION 19 may be re-written for two aggregate eddy current measurements taken at two different temperatures as:

$$V_1 = B_1 R_{c-CF1} + C_1 \beta R_{c-CF2} \quad \text{[EQUATION 20]}$$

$$V_2 = B_2 R_{c-CF1} + C_2 \beta R_{c-CF2} \quad \text{[EQUATION 21]}$$

where, $B_1 = \rho_{CF1}(T_c)/\rho_{CF1}(T_1)$, $B_2 = \rho_{CF1}(T_c)/\rho_{CF1}(T_2)$, $C_1 = \rho_{CF2}(T_c)/\rho_{CF2}(T_1)$, $C_2 = \rho_{CF2}(T_c)/\rho_{CF2}(T_2)$.

As commonly understood in the art, EQUATION 20 and EQUATION 21 can be further simplified using Cramer's Rule:

$$R_{c-CF1} = \frac{\begin{vmatrix} V_1 & C_1 \\ V_2 & C_2 \end{vmatrix}}{\begin{vmatrix} B_1 & C_1 \\ B_2 & C_2 \end{vmatrix}} = \frac{(V_1 C_2 - V_2 C_1)}{(B_1 C_2 - B_2 C_1)} \quad \text{[EQUATION 22]}$$

$$\beta R_{c-CF2} = \frac{\begin{vmatrix} V_1 & B_1 \\ V_2 & B_2 \end{vmatrix}}{\begin{vmatrix} C_1 & B_1 \\ C_2 & B_2 \end{vmatrix}} = \frac{(V_1 B_2 - V_2 B_1)}{(C_1 B_2 - C_2 B_1)} \quad \text{[EQUATION 23]}$$

For demonstration, this equation can be further simplified in the case in which one of the eddy current response measurements is taken at the calibration temperature. For example, if $T_1$ is the calibration temperature (e.g. $T_C = T_1$), EQUATION 20 and EQUATION 21 can be rewritten as follows:

$$V_1 = R_{c-CFF1} + \beta R_{c-CF2} \quad \text{[EQUATION 24]}$$

$$V_2 = B_2 R_{c-CF1} + C_2 \beta R_{c-CF2} \quad \text{[EQUATION 25]}$$

where, $B_2 = \rho_{CF1}(T_c)/\rho_{CF1}(T_2) = (1 + \alpha_{CF1} \Delta T_2)^{-1}$, and $C_2 = \rho_{CF2}(T_c)/\rho_{CF2}(T_2) = (1 \alpha_{CF2} \Delta T_2)^{-1}$.

Again, as commonly understood in the art, EQUATION 24 and EQUATION 25 can be further simplified using Cramer's Rule:

$$R_{c-CF1} = \frac{\begin{vmatrix} V_1 & 1 \\ V_2 & C_2 \end{vmatrix}}{\begin{vmatrix} 1 & 1 \\ B_2 & C_2 \end{vmatrix}} = \frac{(V_1 C_2 - V_2)}{(C_2 - B_2)} \quad \text{[EQUATION 26]}$$

$$\beta R_{c-CF2} = \frac{\begin{vmatrix} V_1 & B_1 \\ V_2 & B_2 \end{vmatrix}}{\begin{vmatrix} C_1 & B_1 \\ C_2 & B_2 \end{vmatrix}} = \frac{(V_1 B_2 - V_2)}{(B_2 - C_2)} \quad \text{[EQUATION 27]}$$

Expanding, for example, the denominator of EQUATION 26:

$$R_{c-CF1} = \frac{V_1(1 + \alpha_{CF2}\Delta T_2)^{-1} - V_2}{(1 + \alpha_{CF2}\Delta T_2)^{-1} - (1 + \alpha_{CF1}\Delta T_2)^{-1}} \quad \text{[EQUATION 28]}$$

Further simplifying EQUATION 26:

$$R_{c-CF1} = \frac{V_1(1 + \alpha_{CF2}\Delta T_2)^{-1} - V_2}{(1 + \alpha_{CF2}\Delta T_2)^{-1} - (1 + \alpha_{CF1}\Delta T_2)^{-1}} \frac{(1 + \alpha_{CF2}\Delta T_2)}{(1 + \alpha_{CF2}\Delta T_2)} \quad \text{[EQUATION 29]}$$

$$R_{c-CF1} = \frac{V_1 - V_2(1 + \alpha_{CF2}\Delta T_2)}{1 - \frac{(1 + \alpha_{CF2}\Delta T_2)}{(1 + \alpha_{CF1}\Delta T_2)}} \quad \text{[EQUATION 30]}$$

where $R_{c-CF1}$ is the eddy current response of the first conductive film at the calibration temperature, $\alpha_{CF1}$ is the temperature coefficient for the first conductive film in deg $C.^{-1}$, $\alpha_{CF2}$ is the temperature coefficient for the second conductive film in deg $C.^{-1}$, $\Delta T_2$ is the difference between the calibration temperature $T_c$ and the measured temperature $T_2$, $V_1$ is the aggregate eddy current response at the calibration temperature $T_c$, and $V_2$ is the aggregate eddy current response at the measured temperature $T_2$. Note that if one is only interested in conductive film 1, no knowledge of the relative contribution of the two films (i.e., $\beta$, etc.) is required. One may now construct the normal correlation functions based off of $R_{c-CF1}$ as the substrate and temperature independent eddy current response and thus report an improved eddy current result such as CF1 film thickness.

Likewise, the eddy current response for $R_{c-CF2}$ may be shown as $$\beta R_{c-CF2} = \frac{V_2(1 + \alpha_{CF2}\Delta T_2) - V_1}{\frac{(1 + \alpha_{CF2}\Delta T_2)}{(1 + \alpha_{CF1}\Delta T_2)} - 1} \quad \text{[EQUATION 31]}$$

again where $R_{c-CF2}$ is the eddy current response of the second conductive film at the calibration temperature, $\beta$ is a conductive film thickness dependent ratio, $\alpha_{CF1}$ is the temperature coefficient for the first conductive film in deg $C.^{-1}$, $\alpha_{CF2}$ is the temperature coefficient for the second conductive film in deg $C.^1$, $\Delta T_2$ is the difference between the calibration temperature $T_c$ and the measured temperature $T_2$, $V_1$ is the aggregate eddy current response at the calibration temperature $T_c$, and $V_2$ is the aggregate eddy current response at the measured temperature $T_2$. If both film signals are desired across significant differences in film thickness, one may construct wafers to measure the relative contributions to the eddy current measurements as for the film stacks of interest. For example in the case where a copper film (CF1=copper) is primarily varying across some range of thicknesses, one may determine $\beta(d_{c-CF1})$ over the range of interest and use the correlation results based on EQUATION 30 to determine an eddy current response $R_{c-CF2}$ normalized across various film thicknesses by dividing EQUATION 31 by $\beta(d_{c-CF1})$.

Referring now to FIG. 7, a simplified diagram showing a method of determining a thickness of a conductive film formed of a conductive material on a target substrate, according to one embodiment of the invention. Initially, at 702, a first eddy current sensor is positioned near a set of positions on the target substrate. In an embodiment, the set of positions is only one position. Next at 704, a set of sensor electrical responses that includes at least one of a voltage measurement and a current measurement is measured. Next, at 706, the set of electrical responses is corrected using a temperature-dependent compensation factor. In general, the temperature-dependent compensation factor is derived from another substrate and is dependent on temperature change. Finally, at 708, the thickness is determined using the corrected first set of electrical responses.

While this invention has been described in terms of several preferred embodiments, there are alterations, permutations, and equivalents which fall within the scope of this invention. It should also be noted that there are many alternative ways of implementing the methods of the present invention. In addition, the invention is not limited to a particular sensor design, method of detection, excitation frequency, active or passive electrical components or any other peculiarities of a sensor vendor's method of reporting a sensible signal to be measured. Also, more than two sensors may be used. Furthermore, the term set as used herein includes one or more of the named element of the set. For example, a set of "X" refers to one or more "X."

Advantages of the invention include methods and apparatus for optimizing an electrical response to a conductive layer on a substrate. Additional advantages include the use of relatively inexpensive equipment to refine proximity correction, and higher substrate measurement throughput.

Having disclosed exemplary embodiments and the best mode, modifications and variations may be made to the disclosed embodiments while remaining within the subject and spirit of the invention as defined by the following claims.

What is claimed is:

1. A method of determining a first thickness of a first conductive film formed of a first conductive material on a target substrate, comprising:
   positioning a first eddy current sensor near a set of positions on said target substrate;
   measuring, using said first eddy current sensor, a first set of electrical responses that includes at least one of a first voltage measurement and a first current measurement;
   correcting said set of first electrical responses using a temperature-dependent compensation factor, thereby obtaining a corrected first set of electrical responses, said temperature-dependent compensation factor being obtained from a calibration substrate different from said target substrate, said calibration substrate having a second conductive film formed of a second conductive material that is substantially similar to said first conductive material of said target substrate; and
   determining said first thickness using said corrected first set of electrical responses.

2. The method of claim 1 wherein said temperature-dependent compensation factor is obtained by measuring a second set of electrical responses from said calibration substrate; and selecting said temperature-dependent compensation factor from a known set of compensation factors, said temperature-dependent compensation factor correlating to said second set of electrical responses.

3. The method of claim 2 wherein said known set of compensation factors compensate for a set of known differences in target film temperature variations between said calibration substrate and said target substrate.

4. The method of claim 2 wherein said known set of compensation factors includes an estimated target film thickness.

5. The method of claim 2 wherein said known set of compensation factors relate to changes in resistivity of said second conductive material responsive to changes in temperature.

6. The method of claim 2 wherein said second set of electrical responses representing an averaging of electrical responses measured on said calibration substrate, said averaging reducing errors due to temperature drifts.

7. The method of claim 2 wherein said measuring said first set of electrical responses and said measuring said second set of electrical responses are performed using said first eddy current sensor.

8. The method of claim 5 wherein said measuring said first set of electrical responses and said measuring said second set of electrical responses are performed using substantially similar measurement protocols.

9. The method of claim 2 wherein said measuring said second set of electrical responses is performed using a second eddy current sensor different from said first eddy current sensor.

10. The method of claim 1 wherein said determining said first thickness includes correlating said corrected first set of electrical responses with a set of thickness correlation curves.

11. The method of claim 1 wherein said first conductive film comprises at least one of aluminum and copper.

12. The method of claim 1 wherein said first set of electrical responses represents a set of electrical responses that has been corrected for proximity variation between said first eddy current sensor and said target substrate.

13. The method of claim 1 wherein said target substrate and said calibration substrate are selected to have substantially the same resistivity responses to temperature changes within a temperature range of interest that includes a temperature at which said first set of electrical responses are measured and temperatures at which said set of compensation factors are obtained.

14. An arrangement for determining a first thickness of a first conductive film formed of a first conductive material on a target substrate, comprising:
    means for measuring, using a first eddy current sensor positioned near said target substrate, a first set of electrical responses that includes at least one of a first voltage measurement and a first current measurement;
    means for correcting said set of first electrical responses using a temperature-dependent compensation factor, thereby obtained a corrected first set of electrical responses, said temperature-dependent compensation factor being obtained from a calibration substrate different from said target substrate, said calibration substrate having a second conductive film formed of a second conductive material that is substantially similar to said first conductive material of said target substrate; and
    means for determining said first thickness using said corrected first set of electrical responses.

15. The arrangement of claim 14 wherein said temperature-dependent compensation factor is obtained by measuring a second set of electrical responses from said calibration substrate different from said target substrate, and selecting said temperature-dependent compensation factor from a known set of compensation factors, said temperature-dependent compensation factor correlating to said second set of electrical responses.

16. The arrangement of claim 15 wherein said known set of compensation factors compensate for a set of known differences in target film temperature variations between said calibration substrate and said target substrate.

17. The arrangement of claim 15 wherein said known set of compensation factors includes an estimated target film thickness.

18. The arrangement of claim 15 wherein said known set of compensation factors relate to changes in resistivity of said second conductive material responsive to changes in temperature.

19. The arrangement of claim 15 wherein said second set of electrical responses representing an averaging of electrical responses measured on said calibration substrate, said averaging reducing errors due to temperature drifts.

20. The arrangement of claim 15 wherein said target substrate and said calibration substrate are selected to have substantially the same resistivity responses to temperature changes within a temperature range of interest that includes a temperature at which said first set of electrical responses are measured and temperatures at which said set of compensation factors are obtained.

21. A method of determining a first thickness of a first conductive film formed of a first conductive material on a target substrate, comprising:
    positioning a first eddy current sensor near said target substrate;
    measuring, using said first eddy current sensor, a first set of electrical responses that includes at least one of a first voltage measurement and a first current measurement;
    correcting said set of first electrical responses using a temperature-dependent compensation factor that is determined based on a target substrate temperature at which said first set of electrical responses are obtained, said temperature-dependent compensation factor being obtained from a calibration substrate different from said target substrate, said calibration substrate having a second conductive film formed of a second conductive material that is substantially similar to said first conductive material of said target substrate, thereby obtaining said corrected first set of electrical responses; and;
    determining said first thickness using said corrected first set of electrical responses.

22. The method of claim 21 wherein said second conductive material has a substantially similar resistivity responses to temperature changes as said target substrate.

23. The method of claim 22 wherein said temperature-dependent compensation factor relates to changes in resistivity of said second conductive material responsive to changes in temperature.

24. The method of claim 22 wherein said second set of electrical responses representing an averaging of electrical responses measured on said calibration substrate, said averaging reducing errors due to temperature drifts.

25. The method of claim 22 wherein said measuring said first set of electrical responses and said measuring said second set of electrical responses are performed using said first eddy current sensor.

26. The method of claim 22 wherein said measuring said first set of electrical responses and said measuring said second set of electrical responses are performed using substantially similar measurement protocols.

27. The method of claim 22 wherein said measuring said second set of electrical responses is performed using a second eddy current sensor different from said first eddy current sensor.

28. The method of claim 22 wherein said determining said first thickness includes correlating said corrected first set of electrical responses with a set of thickness correlation curves.

29. The method of claim 22 wherein said target substrate and said calibration substrate are selected to have substantially the same resistivity responses to temperature changes within a temperature range of interest that includes a temperature at which said first set of electrical responses are measured and temperatures at which said set of compensation factors are obtained.

* * * * *